United States Patent
Ihle et al.

(10) Patent No.: US 7,936,247 B2
(45) Date of Patent: May 3, 2011

(54) RESISTOR ARRANGEMENT AND METHOD FOR PRODUCING A RESISTOR ARRANGEMENT

(75) Inventors: Jan Ihle, Deutschlandsberg (AT); Werner Kahr, Deutschlandsberg (AT)

(73) Assignee: Epcos AG, Munich (DE)

( * ) Notice: Subject to any disclaimer, the term of this patent is extended or adjusted under 35 U.S.C. 154(b) by 38 days.

(21) Appl. No.: 12/356,417

(22) Filed: Jan. 20, 2009

(65) Prior Publication Data

US 2009/0174521 A1 Jul. 9, 2009

Related U.S. Application Data

(63) Continuation of application No. PCT/DE2007/001296, filed on Jul. 19, 2007.

(30) Foreign Application Priority Data

Jul. 20, 2006 (DE) .......................... 10 2006 033 711

(51) Int. Cl.
*H01C 3/00* (2006.01)

(52) U.S. Cl. ........................... 338/210; 338/53; 338/237

(58) Field of Classification Search .................. 338/210, 338/53, 55, 99, 235, 237, 250
See application file for complete search history.

(56) References Cited

U.S. PATENT DOCUMENTS

| | | | |
|---|---|---|---|
| 3,033,970 A | | 5/1962 | Eisler |
| 4,368,380 A | | 1/1983 | Igashira et al. |
| 4,544,828 A | | 10/1985 | Shigenobu et al. |
| 5,534,061 A | | 7/1996 | Fitzburgh |
| 6,278,092 B1 | * | 8/2001 | Wu ............................... 219/549 |
| 6,373,373 B1 | * | 4/2002 | Saito ............................... 338/47 |
| 6,483,055 B1 | * | 11/2002 | Tanabe et al. ............... 200/85 A |
| 2003/0047549 A1 | | 3/2003 | Horey et al. |
| 2003/0164361 A1 | | 9/2003 | Marega et al. |
| 2004/0262644 A1 | | 12/2004 | Naruse et al. |
| 2006/0102615 A1 | | 5/2006 | Carriere |
| 2007/0164079 A1 | | 7/2007 | Mori et al. |
| 2007/0175969 A1 | | 8/2007 | Wada |

FOREIGN PATENT DOCUMENTS

| | | |
|---|---|---|
| CH | 404 821 | 12/1965 |
| DE | 31 07 290 A1 | 1/1982 |
| DE | 8309023.1 | 2/1986 |
| DE | 601 06 757 T2 | 12/2005 |
| EP | 0 909 118 A2 | 4/1999 |
| GB | 732437 | 6/1955 |
| WO | WO 84/03586 | 9/1984 |
| WO | WO 98/10190 | 3/1998 |
| WO | WO 98/18615 | 5/1998 |
| WO | WO 2004/017679 A2 | 2/2004 |
| WO | WO 2005/081602 A1 | 9/2005 |
| WO | WO 2006/070658 A1 | 7/2006 |

* cited by examiner

*Primary Examiner* — Kyung Lee
(74) *Attorney, Agent, or Firm* — Slater & Matsil, L.L.P.

(57) ABSTRACT

A resistor arrangement with resistor elements is specified that are arranged essentially regularly and that are spaced apart from each other and that are interconnected by a flexible substrate. According to a first preferred embodiment, intermediate spaces that are provided to carry a flow of flowing medium are arranged between the resistor elements. According to a second preferred embodiment, the resistor elements are arranged between two flexible substrates and are rigidly connected to these substrates. According to a third preferred embodiment, an electrically insulating adhesive layer that has openings through which the resistor elements are conductively connected to the substrate is arranged between the resistor elements and the substrate. According to a fourth preferred embodiment, the substrate is composed of, as a ground material, an elastic plastic that is filled with electrically conductive particles. In addition, a method for producing the resistor arrangement is specified.

22 Claims, 3 Drawing Sheets

RESISTOR ARRANGEMENT AND METHOD FOR PRODUCING A RESISTOR ARRANGEMENT

This application is a continuation of co-pending International Application No. PCT/DE2007/001296, filed Jul. 19, 2007, which designated the United States and was not published in English, and which claims priority to German Application No. 10 2006 033 711.5 filed Jul. 20, 2006, both of which applications are incorporated herein by reference.

BACKGROUND

A resistor arrangement with small grains made from PTC material distributed in a binding agent is known from the German patent publication DE 3107290 A1. Another resistor arrangement is known from U.S. Pat. No. 4,368,380.

SUMMARY

In one aspect, the present invention specifies a resistor arrangement that is suitable for the efficient heat dissipation on a curved surface.

According to a first preferred embodiment, a resistor arrangement is specified with essentially regularly arranged resistor elements that are interconnected by a common flexible substrate. Between the resistor elements, intermediate spaces are arranged that are provided to carry a medium flow. The flowing medium is advantageously a fluid, such as, e.g., air, oil, water, another gas or another liquid.

According to a second preferred embodiment, a resistor arrangement is specified with essentially regularly arranged resistor elements that are spaced apart from each other. The resistor elements are arranged between two flexible substrates and connected rigidly to these substrates.

According to a third preferred embodiment, a resistor arrangement is specified with essentially regularly arranged resistor elements that are spaced apart from each other and interconnected by a common flexible substrate. Between the resistor elements and the substrate there is an electrically insulating adhesive layer that has openings through which the resistor elements are conductively connected to the substrate.

According to a fourth preferred embodiment, a resistor arrangement is specified with essentially regularly arranged resistor elements that are spaced apart from each other and are interconnected by a common flexible substrate. As a ground material, the substrate is composed of an elastic plastic that is filled with electrically conductive particles. The ground material, such as, e.g., silicone rubber, can be an electrically insulating material that is made conductive by the addition of conductive particles. As the ground material, in particular, an adhesive, such as, e.g., silicone adhesive is suitable as it remains flexible after curing.

The preferred embodiments can be combined with each other arbitrarily.

Below, advantageous configurations of the resistor arrangement will be described that apply to all preferred embodiments.

The resistor arrangement advantageously can have a planar construction. The resistor elements advantageously can have a flat construction. The substrate is advantageously flexible, but can also be present in the form of a rigid plate.

The resistor elements are advantageously ceramic elements that are composed of an advantageously solid, rigid, sintered ceramic body. The ceramic body can be constructed as a resistor layer. The ceramic body advantageously has PTC properties. PTC stands for Positive Temperature Coefficient. As the PTC material, for example, a PTC ceramic based on $BaTiO_3$ is suitable.

In one advantageous variant, the resistor elements are provided as heating elements. The resistor arrangement is advantageously a heating device.

In another variant, the resistor elements are provided as sensor elements. Sensor elements are suitable for detecting a physical parameter, such as, e.g., temperature. The resistor arrangement is, in this case, a sensor device.

The resistor elements advantageously have a flat or smooth surface. They are advantageously planar (plate-shaped), wherein the lateral cross-sectional size of each resistor element exceeds its height. The resistor elements are advantageously rectangular and, in particular, square. The resistor elements, however, can have another arbitrary ground shape, e.g., that of a polygon or circle.

Advantageously, a gap (advantageously an air gap) whose width is advantageously smaller than the lateral cross-sectional size of a resistor element is arranged between two adjacent resistor elements.

The resistor elements are advantageously arranged regularly so that gaps in the form of channels are formed between the elements. These gaps can be filled by a flowing medium, such as, e.g., liquid or gas. The relative arrangement and width of the gaps is advantageously selected so that they form a network that can carry a flow (percolation network). The gaps are advantageously interconnected so that the gap arrangement is free of "dead ends." The resistor elements advantageously form a regular, two-dimensional arrangement in a lateral plane if the resistor arrangement lies on a flat underlayer. In one variant, such an arrangement can have several rows and columns. A checkerboard arrangement is also possible.

The flexible substrate is advantageously made from a thermally highly conductive material whose coefficient of thermal conductivity is advantageously higher than that of the resistor elements. Thus, a good thermal connection of the resistor elements is guaranteed.

In one advantageous variant, the flexible substrate represents a thin, flexible film that is tear-resistant. The flexible substrate is advantageously not rigid and has a variable shape (changeable in form) to the extent that, when it is placed on a non-flat surface, it essentially assumes the shape of this surface without the application of force.

Through the flexible substrate, an essentially positive-fit arrangement of the resistor arrangement on the surface to be heated is possible. The greater the curvature of the surface to be heated, the smaller the selected size of the resistor elements.

The substrate is advantageously elastic. In one example, the substrate can comprise a rubber-like film. Any organic polymers can be considered as material for the substrate. The substrate can comprise of, e.g., rubber, in particular, silicone rubber.

The flexible substrate can consist of, for example, Ni, Cr, Ag, Cu, Al, or other metal particles. The flexible substrate can also consist of at least one metal layer, advantageously a Cr, Ni, or Cr/Ni layer.

On the main surfaces of the resistor layer, a metal layer that is suitable for contacting resistor elements, such as, e.g., Cr, Ni, Al, Zn, Ag, is advantageously deposited for forming electrodes of the resistor element. Each resistor element advantageously has a first and a second electrode.

The first electrodes of the resistor elements can be electrically interconnected by a conductive region of a flexible first substrate. The second electrodes of the resistor elements can be electrically interconnected by a conductive region of a flexible second substrate.

The conductive region of each substrate can be formed by a conductive sub-region of the substrate. The substrate can also be composed of at least one electrically insulating sub-layer that is advantageously turned outward and away from the resistor elements. The conductive region can also be formed by a region of the substrate filled with metal particles. The conductive region can be formed alternatively by at least one wire that is set in an electrically insulating ground material of the substrate. The one or more wires are advantageously composed of a wire mesh.

The first electrodes of the resistor elements can be conductively interconnected by means of supply lines that are integrated in the substrate or arranged on the surface of the substrate. The second electrodes of the resistor elements can also be conductively interconnected in this way. The second electrodes, however, can also be electrically connected by an electrically conductive surface that contacts the resistor arrangement but that is not a constituent of this arrangement. The electrical contacting of the second electrodes by the resistor elements can be realized, for example, by a conductive object to be heated, on which the second main surfaces of the resistor elements are to be pressed.

The electrical contacting of the first electrodes by the resistor elements via the common substrate is also possible when this substrate is composed of at least one electrically conductive layer, e.g., a copper-containing metal layer. The substrate can be composed of an electrically insulating, advantageously elastic, film that is coated with the metal layer. The metal layer can be constructed as metal lamination, advantageously copper lamination. Alternatively, the substrate can be composed of, in principle, a self-supporting metal film that is advantageously embedded in a flexible substrate, such as, e.g., a silicone substrate.

The metal layer and the resistor elements are advantageously interconnected by means of an adhesive layer that has, in the region of each resistor element, at least one opening through which the metal layer can electrically contact the main surface of each resistor element. This opening represents a via contact through the adhesive layer.

The flexible substrate can be constructed as a group, i.e., lattice with recesses for holding resistor elements. The recesses are advantageously constructed as openings. In one variant, the thickness of the resistor elements exceeds that of the substrate. The resistor elements project from the substrate advantageously on both sides. On at least one of the main surfaces of the resistor arrangement, the resistor elements can also be interconnected, as already described, by another substrate that has an electrically conductive region. Advantageously, on each side of the resistor arrangement there is such a substrate.

In the resistor arrangement according to the second, third, and fourth embodiment, the gaps between the resistor elements can be filled by a flexible, electrically insulating material. For example, the first main surfaces of the resistor elements can be mechanically, thermally, and electrically interconnected by a conductive silicone substrate, wherein the intermediate spaces between the resistor elements are filled with electrically insulating but very thermally conductive silicone or another flexible material. The very thermally conductive material advantageously has a better coefficient of thermal conductivity than the body of the resistor element. Thus, compared with a gap filled with air or gas, the thermal connection between the resistor elements can be improved.

This material can be cured silicone or some other rubber-like material. This material can also be fluid, viscous, or gel-like.

A flexible resistor arrangement can be produced, for example, in a method with the following steps. Initially, a flexible film is connected to a plate that is composed of PTC material. The main surfaces of the plates are advantageously coated with metal. The plate is separated along separation lines such that the flexible film is not cut. For this purpose, advantageously a hard underlayer and a precision saw are used.

One alternative method includes the following steps: first an elastic substrate with regularly arranged, prefabricated openings and a plurality of (separated) plate-shaped resistor elements is prepared. The plate-shaped resistor elements are placed into the openings of the film. The first main surfaces of the resistor elements are connected to a flexible cover. In some circumstances, the second main surfaces of the resistor elements are also connected to another flexible cover.

BRIEF DESCRIPTION OF THE DRAWINGS

The specified resistor arrangement and also the method for its production will now be explained with reference to schematic figures that are not true to scale. Shown are.

Figure 1:
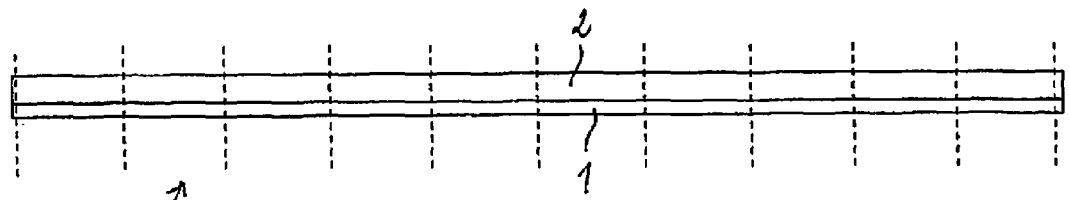
FIG. 1, shows in cross section, a composite of the flexible substrate and the ceramic plate that is composed of resistor elements before the separation of the resistor elements.

The following list of reference symbols can be used in conjunction with the drawings:
1 Flexible substrate
11 Carrier film
12 Metal layer
13 Adhesive layer
2 Ceramic plate
21, 22, 23 Resistor element
3 First cover
31 Carrier film
32 Metal layer
4 Second cover
5 Gap
6 Gap
7 Opening through the adhesive layer 13
9 Object to be heated

DETAILED DESCRIPTION

FIG. 1 shows a ceramic plate 2 that forms a composite with a substrate 1. The thickness of the ceramic plate 2 exceeds that of the substrate 1.

Figure 5:
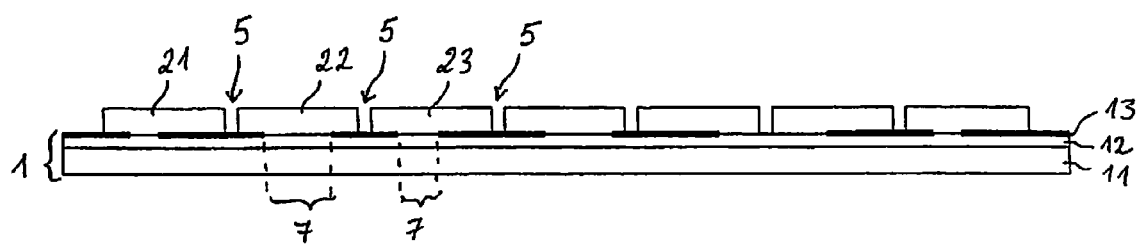
FIG. 5, shows in cross section, a resistor arrangement according to the third preferred embodiment.

The substrate 1 can be deposited as an advantageously viscous layer on the ceramic plate 2. After curing, this layer forms a composite with the ceramic plate. The ceramic plate and the substrate, however, can also be interconnected through bonding as indicated in FIG. 5.

Figure 2:
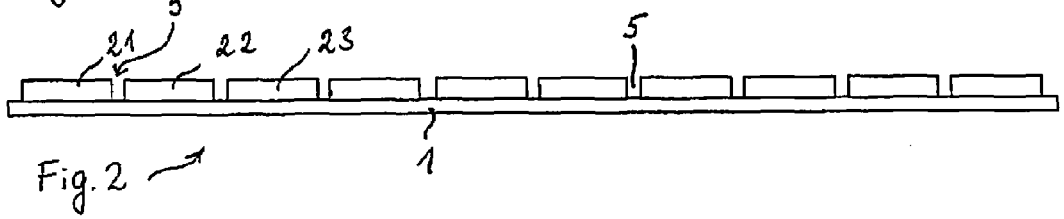
FIG. 2, shows in cross section, the resistor arrangement after the separation of the resistor elements.
Figure 3:
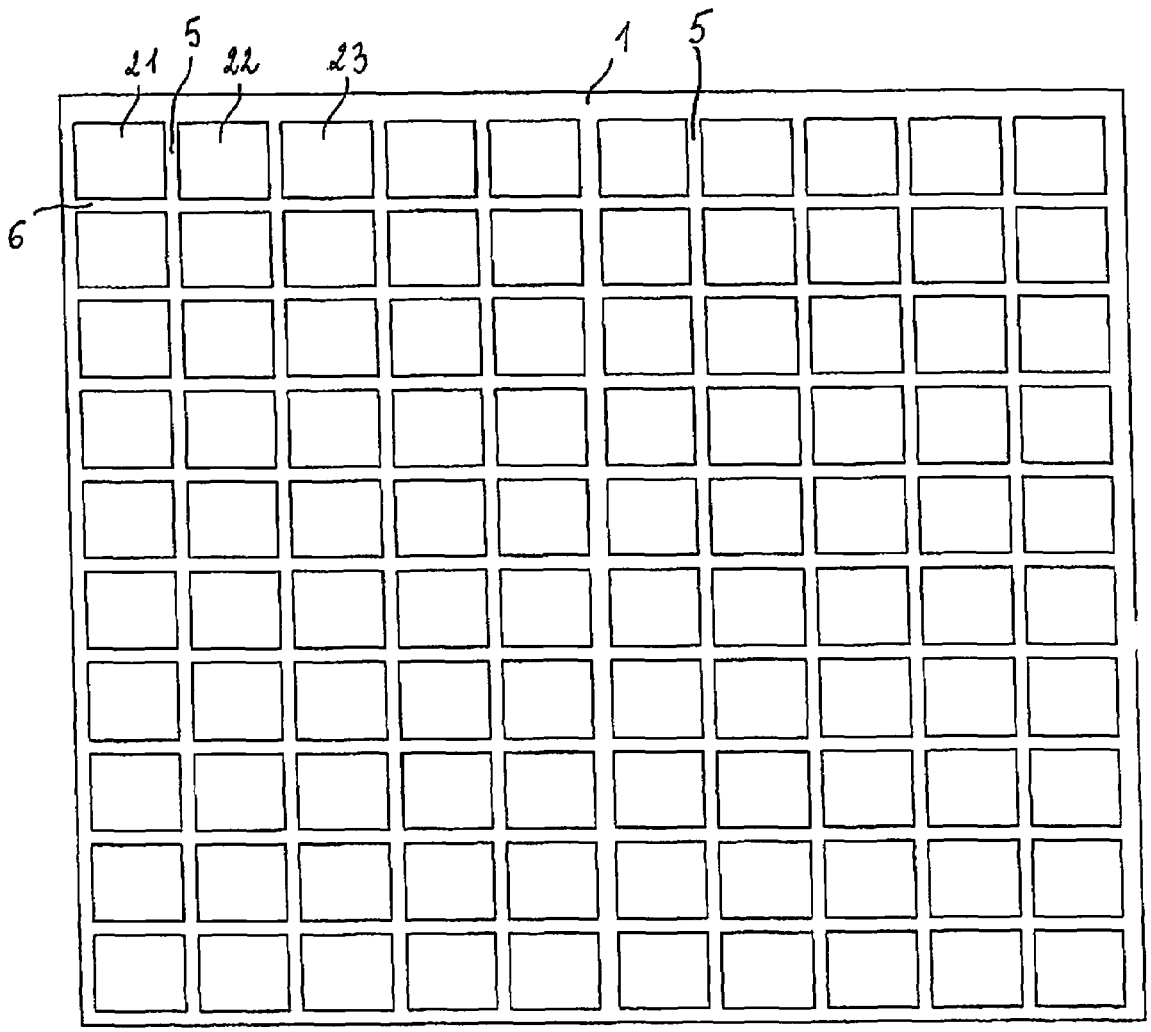
FIG. 3, shows in a top view, the resistor arrangement according to FIG. 2 after the separation of the resistor elements.

Separation lines are indicated by dashed lines. The ceramic plate 2 should be cut along these lines for separating the resistor elements 21, 22, 23 shown in FIG. 2. The substrate 1 is here indeed advantageously scored but not cut. After the separation, a resistor arrangement shown in FIGS. 2 and 3 is produced. The resistor elements 21, 22, 23 are separated from each other in a first lateral direction by gaps 5 and in the second lateral direction by gaps 6. The gaps 6 can be eliminated in one variant.

The resistor elements form a regular arrangement of rows and columns (FIG. 3). In this example, the width of the columns arranged between the resistor elements is significantly smaller than the width of the resistor elements.

Each resistor element 21, 22, 23 has metal layers arranged on its main surfaces and a resistor layer arranged between these surfaces. The metal layers are used as electrodes of each resistor element. First electrodes of the resistor elements 21, 22, 23, etc., at the bottom in FIG. 2 are conductively interconnected by, in this case, the electrically conductive substrate 1.

Each gap 5, 6 represents a channel. The gaps are advantageously air gaps. However, as in the example according to FIG. 9, they can also be filled at least partially with an electrically insulating material that prevents a short circuit between the first and second electrodes of the resistor elements.

Figure 4:
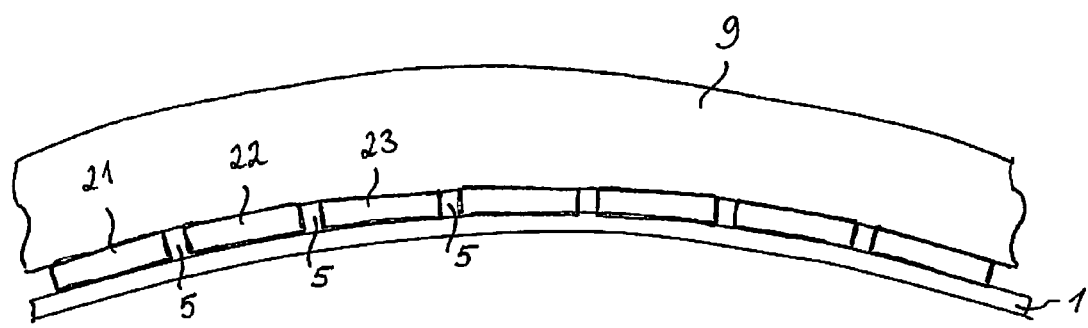
FIG. 4, shows in cross section, the resistor arrangement according to FIG. 2 that is pressed on an object to be heated with a curved surface.

In FIG. 4, the resistor arrangement according to FIGS. 2 and 3 is pressed onto the object 9 to be heated. The object 9 has a curved surface.

In the embodiment shown in FIG. 4, the object 9 to be heated is electrically conductive. In this case, the second electrodes of the resistor elements that were not originally interconnected are now conductively interconnected by means of this object. Alternatively, the second electrodes of the resistor elements can be conductively connected by the electrically conductive, flexible cover 3 shown in FIG. 6. This cover is advantageously formed from the same material as the substrate 1.

Figure 6:
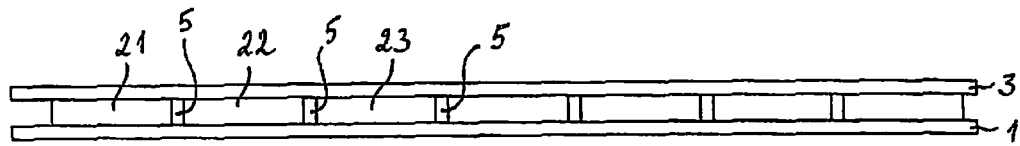
FIG. 6, shows in cross section, a resistor arrangement with resistor elements that are arranged between two flexible substrates according to the second preferred embodiment.
Figure 7:
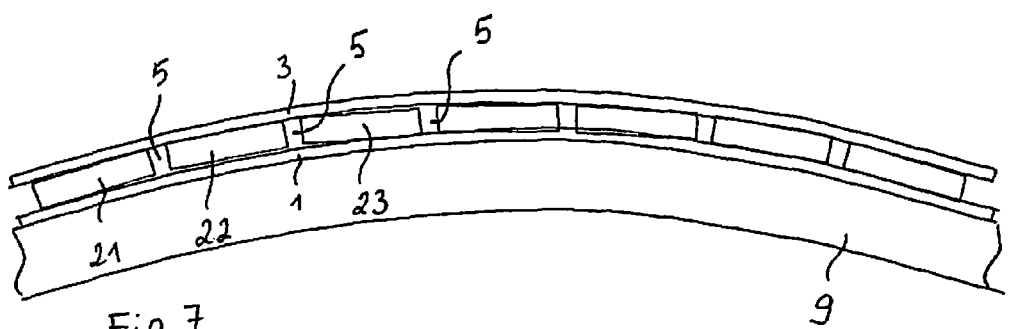
FIG. 7, shows in cross section, the resistor arrangement according to FIG. 6 that is pressed on an object to be heated with a curved surface.

In FIG. 7, the resistor arrangement according to FIG. 6 is shown that is pressed against the object 9 to be heated with a curved surface.

In FIG. 5, another embodiment is presented in which the substrate 1 is composed of a flexible, advantageously electrically insulating carrier film 11 and a metal layer 12. The substrate 1 and the resistor elements 21, 22, 23 are interconnected by means of an electrically insulating adhesive layer 13. This adhesive layer has openings 7 that each act as a via contact. The thickness of the adhesive layer 13 is selected so that it is ensured that when the substrate 1 and the ceramic plate 2 are pressed together in the region of each resistor element at least one such opening is formed. Consequently, the resistor elements are all conductively connected to the metal layer 12 of the substrate 1 despite the adhesive layer 13.

Figure 8:
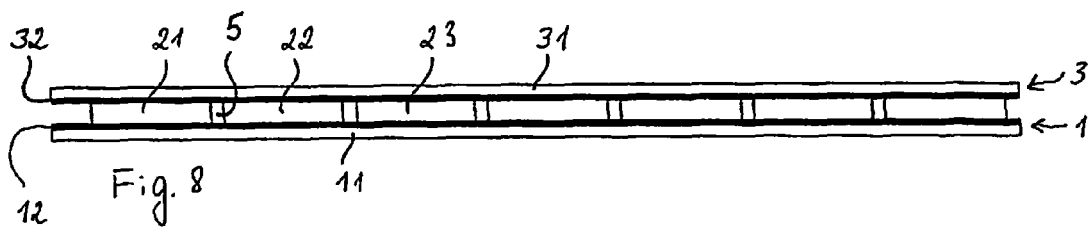
FIG. 8, shows a variant of the resistor arrangement presented in FIG. 6, wherein the substrates are each composed of an electrically insulating carrier film and a metal film.

In FIG. 8, another configuration is shown that represents a combination of the variants according to FIGS. 5 and 6. The cover 3 has a flexible carrier film 31 and a metal layer 32 that is deposited on this carrier film and that, similarly to the metal layer 12, conductively interconnects the second electrodes of the resistor elements.

The substrate 1 and also each cover 3, 4 shown in FIGS. 6 to 9 provides for the mechanical, thermal, and optionally electrical connection of the individual resistor elements 21, 22, 23, etc. In order to avoid a short circuit between electrical terminals of the resistor arrangement, the substrate 1 and the cover 3 (or the covers 3, 4 in FIG. 9) do not contact each other.

In the embodiments according to FIGS. 6 and 8, it is advantageous if the cover 3 has the same composition and thickness as the substrate 1. It is also possible, however, that the substrate and the cover are of the same material but of different thickness. The use of different materials for the substrate and the cover is also possible.

Figure 9:
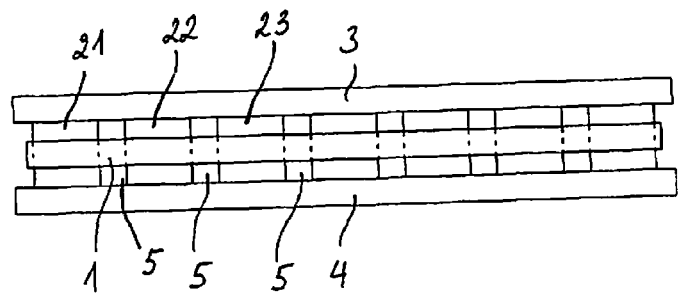
FIG. 9, shows in cross section, a resistor arrangement with a flexible substrate in which regularly arranged openings are formed for holding resistor elements.

In the embodiment according to FIG. 9, the substrate 1 is constructed with regularly arranged openings. The arrangement of the openings forms a perforation pattern and approximately corresponds to the arrangement of resistor elements already explained with reference to FIG. 3. A resistor element is inserted into each opening.

The substrate is advantageously composed of an elastic, electrically insulating film. The form of each opening is advantageously adapted to the form of the resistor element 21, 22, 23 to be inserted into this opening. The size of these openings, however, is advantageously somewhat smaller than that of the resistor elements, so that the resistor element can be held in the opening by elastic forces.

A cover 3, 4 is deposited on both sides of the arrangement of the resistor elements 21, 22, 23, etc. connected to the substrate 1. These covers can each be constructed like the cover 3 explained in the variant according to FIG. 6.

In the variant according to FIG. 9, it is advantageous if the cover 4 has the same composition and thickness as the cover 3 explained above. However, it is also possible that both covers 3, 4 are of the same material but of different thickness. The use of different materials is also theoretically possible.

In the embodiment according to FIG. 9, the thickness of the resistor elements 21, 22, 23 is greater than that of the substrate 1. The resistor elements project from the substrate 1 on both sides (in FIG. 9 at the top and bottom), so that the main surfaces of the resistor elements are exposed, wherein an unfilled intermediate space is present between the side surfaces of the resistor elements on both sides of the resistor arrangement.

In FIG. 9, the gap 5 between the resistor elements 21, 22, 23 is only partially filled by the substrate 1. The rest of the gap 5 can be filled, in principle, with air or gas. However, there is also the possibility of filling the remaining intermediate space arranged between the cover 3, 4 to the substrate 1 and the resistor elements 21, 22, 23 with a flexible material. This material can also be fluid or viscous. This also applies to the configurations according to FIGS. 6 and 8.

In one modification of the variant shown in FIG. 9, the second cover 4 can be eliminated.

What is claimed is:
1. A resistor arrangement comprising
a plurality of flexible substrates, each flexible substrate having an edge; and
a plurality of resistor elements arranged between and connected to the flexible substrates, the resistor elements being spaced apart and being arranged in a substantially regular pattern;
wherein the resistor elements and the flexible substrates form a grid, wherein the grid is impermeable where one resistor is located and permeable where no resistor is located, and wherein the flexible substrates form a sealed area along and between edges of the flexible substrates; and an adhesive isolation layer disposed between the resistor elements and one of the flexible substrates, wherein the adhesive isolation layer has openings through which the resistor elements are connected to the one flexible substrate.

2. The resistor arrangement according to claim 1, wherein the flexible substrate comprises a flexible plastic material filled with electrically conductive particles.

3. The resistor arrangement according to claim 1, wherein the resistor elements are spaced apart by channels.

4. The resistor arrangement according to claim 1, wherein spaces between the resistor elements are partly filled with an electrically non-conductive material.

5. The resistor arrangement according to claim 1, wherein each resistor element comprises a first electrode and wherein the first electrodes are interconnected.

6. The resistor arrangement according to claim 5, wherein each resistor element comprises a ceramic body with PTC characteristics.

7. The resistor arrangement according to claim 1, wherein each flexible substrate comprises a layer with elastic properties.

8. A resistor arrangement, comprising
a plurality of flexible substrates, each flexible substrate having an edge; and
a plurality of resistor elements arranged between and connected to the flexible substrates, the resistor elements being spaced apart and being arranged in a substantially regular pattern,
wherein the resistor elements and the flexible substrates form a grid, wherein the grid is impermeable where one resistor is located and permeable where no resistor is located, and wherein the flexible substrates form a sealed area along and between edges of the flexible substrates, wherein at least one of the flexible substrates comprises a metal layer disposed on an electrically isolating layer, wherein the metal layer and the resistor elements are connected via an adhesive layer, wherein the adhesive layer comprises openings and wherein the resistor elements and the metal layer are electrically connected through the openings.

9. The resistor arrangement according to claim 1, wherein the resistor elements form at least one row or column.

10. The resistor arrangement according to claim 1, wherein the first electrodes of the resistor elements are electrically connected to a conductive region of one of the flexible substrates.

11. The resistor arrangement according to claim 10, wherein the conductive region of the substrate comprises a metal layer that is disposed on an electrically isolating and flexible layer.

12. A resistor arrangement comprising:
a first flexible substrate;
a second flexible substrate;
a plurality of essentially regularly arranged resistor elements that are arranged between and connected to the first and second flexible substrates;
an electrically insulating adhesive layer between the resistor elements and the first flexible substrate, the electrically insulating adhesive layer having openings through which the resistor elements are conductively connected to the first flexible substrate; and
intermediate spaces between the resistor elements, the spaces being provided to carry a flow of flowing medium.

13. The resistor arrangement according to claim 12, wherein the first and second flexible substrates each comprise an elastic plastic that is filled with electrically conductive particles.

14. The resistor arrangement according to claim 12, wherein the first and second flexible substrates each comprise a metal layer that is disposed on an electrically insulating film.

15. The resistor arrangement according to claim 12, wherein the resistor elements each comprise a ceramic body with PTC properties and a first electrode, the first electrodes of the resistor elements being conductively interconnected.

16. The resistor arrangement according to claim 12, wherein the intermediate spaces formed between the resistor elements form a percolation network that is permeable in the direction of flow and that is hermetically sealed in a thickness direction of the arrangement.

17. The resistor arrangement according to claim 8, wherein the flexible substrate comprises a flexible plastic material filled with electrically conductive particles.

18. The resistor arrangement according to claim 8, wherein the resistor elements are spaced apart by channels.

19. The resistor arrangement according to claim 8, wherein spaces between the resistor elements are partly filled with an electrically non-conductive material.

20. The resistor arrangement according to claim 8, wherein each resistor element comprises a first electrode and wherein the first electrodes are interconnected, wherein each resistor element comprises a ceramic body with PTC characteristics.

21. The resistor arrangement according to claim 8, wherein each flexible substrate comprises a layer with elastic properties.

22. The resistor arrangement according to claim 8, wherein the first electrodes of the resistor elements are electrically connected to a conductive region of one of the flexible substrates.

* * * * *